US006551175B2

United States Patent
Koichi et al.

(10) Patent No.: US 6,551,175 B2
(45) Date of Patent: Apr. 22, 2003

(54) POLISHING COMPOSITION

(75) Inventors: Naito Koichi, Tokyo (JP); Fujii Shigeo, Wakayama (JP)

(73) Assignee: Kao Corporation, Tokyo (JP)

( * ) Notice: Subject to any disclaimer, the term of this patent is extended or adjusted under 35 U.S.C. 154(b) by 0 days.

(21) Appl. No.: 09/852,764

(22) Filed: May 11, 2001

(65) Prior Publication Data
US 2002/0028636 A1 Mar. 7, 2002

(30) Foreign Application Priority Data

May 12, 2000 (JP) ........................................ 2000-141023
May 12, 2000 (JP) ........................................ 2000-141025

(51) Int. Cl.[7] ................................................ B24B 1/00
(52) U.S. Cl. .............................. 451/41; 451/36; 51/308
(58) Field of Search ............................ 451/41, 36, 28; 51/309, 308, 307

(56) References Cited

U.S. PATENT DOCUMENTS

| 4,475,981 A | * | 10/1984 | Rea .............................. 451/36 |
| 5,697,992 A | * | 12/1997 | Ueda et al. .................... 51/307 |
| 5,935,278 A | * | 8/1999 | Ishitobi et al. ................. 51/306 |
| 5,968,239 A | | 10/1999 | Miyashita et al. |
| 6,062,952 A | | 5/2000 | Robinson et al. |
| 6,120,571 A | * | 9/2000 | Aihara et al. .................. 51/309 |
| 6,152,976 A | * | 11/2000 | Ishitobi et al. ................ 451/36 |
| 6,280,490 B1 | * | 8/2001 | Rader et al. ................... 451/28 |
| 6,293,848 B1 | * | 9/2001 | Fang et al. .................... 451/36 |
| 6,299,516 B1 | * | 10/2001 | Tolles .......................... 451/56 |
| 6,299,659 B1 | * | 10/2001 | Kido et al. .................... 51/309 |
| 6,302,765 B1 | * | 10/2001 | Jacquinot et al. .............. 451/41 |

FOREIGN PATENT DOCUMENTS

| EP | 0 826 756 A1 | 3/1998 |
| JP | A9 20465 7 | 8/1997 |
| JP | A20 00385 72 | 2/2000 |

* cited by examiner

Primary Examiner—Joseph J. Hail, III
Assistant Examiner—Hadi Shakeri
(74) Attorney, Agent, or Firm—Birch, Stewart, Kolasch & Birch, LLP

(57) ABSTRACT

A polishing composition comprising an abrasive and water, wherein the abrasive has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution.

29 Claims, 4 Drawing Sheets 600 nm 600 nm 600 nm 600 nm

POLISHING COMPOSITION

BACKGROUND OF THE INVENTION

1. Field of the Invention

The present invention relates to a polishing composition, a polishing process of a substrate to be polished by applying the polishing composition; and a process for producing a substrate by applying the polishing composition.

2. Discussion of the Related Art

With the increase in the magnetic recording density in the recent years, a floating amount of the magnetic head in memory magnetic disk drive for read-write of magnetic information has been becoming increasingly low. As a result, in the step of surface-polishing in a process of producing a magnetic disk substrate, it has been required to produce a high-precision disk surface capable of having a small floating amount of a magnetic head, the disk surface having excellent surface smoothness (for instance, surface roughness (Ra) and waviness (Wa)), having no surface defects such as projections, scratches, and pits, and being free from errors when reading-writing magnetic information caused by these surface defects.

Also, in the field of semiconductors, the trends of producing thinner wiring have been progressed along with the trends of highly integrated circuits and higher speed at the operating frequencies. Even in the process of producing a semiconductor device, since the focal depth becomes shallow with the trend of thinning the wiring during the exposure of a photoresist, further smoothening of a pattern-forming surface has been desired.

However, in the conventionally used abrasives produced by pulverization, since polishing damages are generated on the polished surface by the coarse grains remaining in the abrasive, there arises a defect that it has been difficult to carry out polishing, with maintaining a surface quality having the above-mentioned surface smoothness. For instance, there is disclosed a glass or silica polishing composition comprising an aqueous dispersion comprising fine serium oxide particles of which particle size distribution of the particle size has two main peaks (Japanese Patent Laid-Open No. 2000-38572). However, the resulting polishing rate and the quality of the polished surface are each unsatisfactory.

In view of the above, a colloidal silica having a narrow particle size distribution and little contamination of the coarse grains has been used. However, when polished with the colloidal silica, although it is relatively easy to accomplish a required high surface precision, there arise some defects that the polishing rate is delayed due to its fine particle size, so that a desired surface precision cannot be obtained in a short time period.

Therefore, as a process of improving the polishing rate, improvements in the polishing rate by using various additives in combination therewith have been proposed. However, none of them were sufficient for accomplishing satisfactory polishing rate. For instance, there is disclosed a polishing composition comprising water, colloidal particles (colloidal silica), aluminum nitrate and a gel-formation preventing agent (Japanese Patent Laid-Open No. Hei 9-204657), but the polishing rate of the resulting polishing composition is unsatisfactory.

In addition, when polishing with the above-mentioned colloidal silica, because of its small particle size, there also arises a defect that a colloidal silica deposited on the polished substrate in the cleaning step after polishing cannot be readily removed. The abrasive remaining on the polished substrate gives rise to causations of unevenness in the thickness of the magnetic recording layer, and the like, thereby resulting in the possibility that the magnetic properties are unstable. Moreover, when the magnetic properties are unstable, there undesirably arise causations for the generation of read-write errors.

In order to solve this defect, various cleaning process for completely removing the remaining abrasive in the cleaning process have been tried without yet achieving a satisfactory level. In addition, since the trend of making the abrasive finer is considered to further progress, its removal has become an increasingly important problem to be solved.

An object of the present invention is to provide a polishing composition which is used for finish-polishing memory hard disks and polishing semiconductor elements, in which the surface smoothness of a polished object after polishing is excellent, no surface defects such as projections and polishing damages are generated, and polishing can be carried out therewith at an economical rate; and a polishing composition capable of maintaining the surface smoothness of the polished substrate, having no surface defects generated, and polishing at an economical rate, without substantially allowing the abrasive to remain on the polished substrate in the cleaning step after polishing.

Another object of the present invention is to provide a polishing process of a substrate to be polished by applying the polishing composition, and a process for producing a substrate by applying the polishing composition.

These and other objects of the present invention will be apparent from the following description.

SUMMARY OF THE INVENTION

According to the present invention, there are provided:

[1] a polishing composition comprising an abrasive and water, wherein the abrasive has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution;

[2] a polishing composition comprising two or more types of abrasives of which D50s are different from each other and water, wherein a ratio of D50L to D50S (D50L/D50S) is from 1.1 to 3.0, and a weight ratio of an abrasive (A) to an abrasive (B) [A/B] is from 90/10 to 10/90, wherein D50 is defined as a particle size at 50% counted from a smaller size side on a number base in a cumulative particle size distribution, wherein the abrasive (A) is defined as an abrasive having the smallest D50 and the abrasive (B) is defined as an abrasive having the largest D50, and wherein D50L is defined as a D50 owned by the abrasive (B) and D50S is defined as a D50 owned by the abrasive (A);

[3] a polishing composition comprising an abrasive and water, wherein the abrasive has a particle size distribution such that (3) a percentage at a particle size of 40 nm counted from a smaller size side on a number base in a cumulative particle size distribution is 25% or less, and wherein (4) D50 is from 50 to 600 nm, wherein D50 is defined as a particle size at 50% counted from a smaller size side on a number base in a cumulative particle size distribution;

[4] a polishing process of a substrate to be polished comprising polishing the substrate to be polished with the polishing composition of any of items [1] to [3] above; and

[5] a process for producing a substrate, comprising the step of polishing a substrate to be polished with the polishing composition of any of items [1] to [3] above.

DETAILED DESCRIPTION OF THE INVENTION

Figure 1:
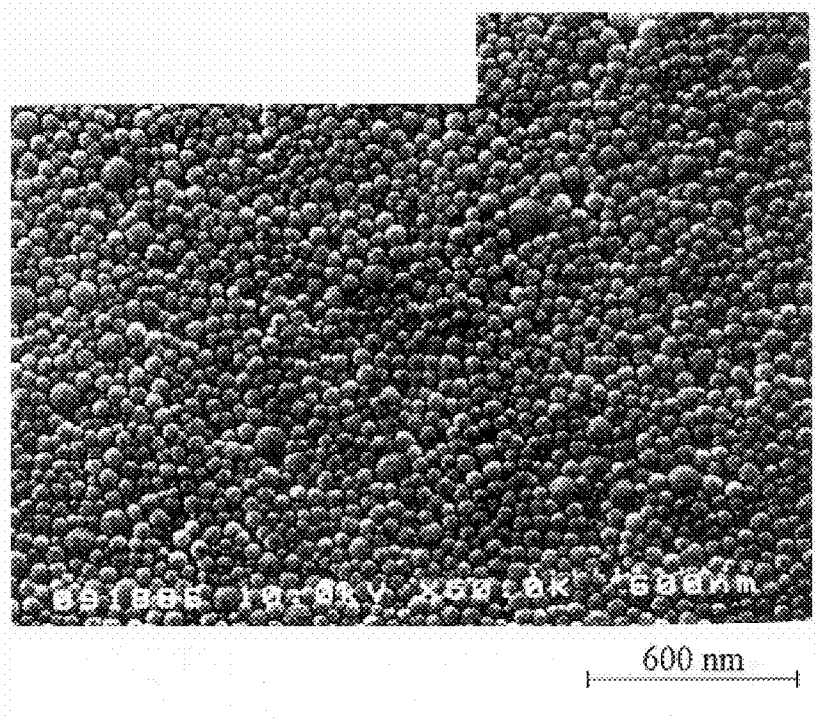
FIG. 1 is a photomicrograph of an FE-SEM image of an abrasive used in Example I-1.

There are two embodiments in the present invention:
(Embodiment 1)

A polishing composition comprising an abrasive and water, wherein the abrasive has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution; or In a case where the polishing composition comprises two or more types of abrasives, of which D50s are different from each other and water, wherein a ratio of D50L to D50S (D50L/D50S) is from 1.1 to 3.0, and a weight ratio of an abrasive (A) to an abrasive (B) [A/B] is from 90/10 to 10/90, wherein the abrasive (A) is defined as an abrasive having the smallest D50 and the abrasive (B) is defined as an abrasive having the largest D50, and wherein D50L is defined as a D50 owned by the abrasive (B) and D50S is defined as a D50 owned by the abrasive (A);
(Embodiment 2)

A polishing composition comprising an abrasive and water, wherein the abrasive has a particle size distribution such that (3) a percentage at a particle size of 40 nm counted from a smaller size side on a number base in a cumulative particle size distribution is 25% or less, and wherein (4) D50 is from 50 to 600 nm.

In the polishing composition of Embodiment 1, by using the abrasive having a particle size distribution such that (1) a ratio of D90 to D50 (D90/D50) is from 1.3 to 3.0, and (2) D50 is from 10 to 600 nm, there are exhibited such effects that the surface roughness of the polished substrate is made small after polishing, and that the substrate to be polished can be polished at an economical speed without generating surface defects such as projections and polishing damages.

In the particle size distribution of the abrasive of this Embodiment 1, D90/D50 is from 1.3 to 3.0, preferably from 1.3 to 2.0, from the viewpoints of preventing the generation of scratches, reducing the surface roughness (Ra), thereby accomplishing smoother and excellent surface quality, and accomplishing a high polishing rate. In addition, D90/D50 is 1.3 or more, from the viewpoint of accomplishing a high polishing rate, and D90/D50 is 3.0 or less, from the viewpoints of maintaining a high polishing rate and obtaining excellent surface smoothness.

D50 of the abrasive usable in this Embodiment 1 is from 10 to 600 nm, preferably from 30 to 200 nm, especially preferably from 40 to 100 nm. D50 is 10 nm or more, from the viewpoint of obtaining a high polishing rate, and D50 is 600 nm or less, from the viewpoints of preventing the generation of surface defects such as scratches and obtaining excellent surface smoothness.

In addition, in this Embodiment 1, in order to obtain a polished substrate having a high polishing rate and excellent surface smoothness, it is preferable that the particle size at 10% counted from a smaller size side on a number base in a cumulative particle size distribution (D10) is preferably from 5 to 100 nm, more preferably from 15 to 85 nm, still more preferably from 35 to 70 nm, especially preferably from 40 to 60 nm. D10 is preferably 5 nm or more, from the viewpoint of obtaining a high polishing rate, and D10 is preferably 100 nm or less, from the viewpoint of maintaining excellent surface smoothness.

In this Embodiment 1, two or more types of the abrasives may be used in combination, and each of D10, D50, D90 is determined for the admixed abrasives.

Next, in this Embodiment 1, when two or more kinds of the abrasives are used in admixture, the particle size distribution of each abrasive before mixing can be defined. In this case, each particle size distribution is defined as follows. One of the great features of this Embodiment 1 resides in that the abrasives comprise two or more types of abrasives of which D50s are different from each other, wherein a ratio of D50L to D50S (D50L/D50S) is from 1.1 to 3.0, and a weight ratio of an abrasive (A) to an abrasive (B) [A/B] is from 90/10 to 10/90, wherein the abrasive (A) is defined as an abrasive having the smallest D50 and the abrasive (B) is defined as an abrasive having the largest D50, and wherein D50L is defied as a D50 owned by the abrasive (B) and D50S is defined as a D50 owned by the abrasive (A). By using the abrasives, there are advantages that the surface roughness of the polished substrate is small after polishing, and polishing of the substrate to be polished can be carried out without generating surface defects such as projections and polishing damages, whereby especially an excellent polishing rate is obtained. Here, when three or more types of abrasives of which D50s are different from each other are used, D50 of the abrasive having the smallest D50 is referred to as "D50S," and D50 of the abrasive having the largest D50 is referred to as "D50L."

D50L/D50S is from 1.1 to 3.0, preferably from 1.5 to 3.0. D50L/D50S is 1.1 or more, from the viewpoint of increasing the polishing rate, and D50L/D50S is 3.0 or less, from the viewpoints of maintaining a high polishing rate, and maintaining excellent surface smoothness, without generating surface defects such as scratches. In the polishing composition, the mixing ratio of two or more types of the abrasives is such that the ratio of D90 to D50 (D90/D50) in the particle size distribution of the particles after mixing satisfies preferably from 1.3 to 3.0, and that D50 (i.e. DSOL and D50S) is preferably from 10 to 600 nm, more preferably from 30 to 200 nm, especially preferably from 40 to 100 nm.

Further, it is preferable that D10 in the particle size distribution of the particles after mixing is from 5 to 100 nm. Incidentally, the mixing weight ratio of an abrasive (A) to an abrasive (B) [A/B] is from 90/10 to 10/90, preferably from 90/10 to 20/80, more preferably from 85/15 to 35/65, wherein A is defined as an abrasive having the smallest D50 and B is defined as an abrasive having the largest D50.

The abrasives used may have two or more types of D50s, and the kinds of the individual abrasives may be identical or different. Here, D50L and D50S mentioned above are each determined prior to mixing.

Next, one of the great features in the polishing composition of Embodiment 2 resides in that the abrasive has a particle size distribution as mentioned above such that (3) a percentage at a particle size of 40 nm counted from a smaller size side on a number base in a cumulative particle size distribution is 25% or less, and wherein (4) D50 is from 50 to 600 nm. By using the abrasive having the particle size distribution, there is exhibited such an effect that the abrasive can be readily cleaned from the surface of the polished object by ordinary cleaning. In addition, there are also exhibited some effects in the cleaning step after polishing that the surface smoothness of the polished substrate is maintained, and that the polishing can be carried out at an economical polishing rate without generating surface defects.

In the abrasive of this Embodiment 2, the percentage at 40 nm counted from a smaller size side on a number base in a cumulative particle size distribution is 25% or less, preferably 15% or less, more preferably 10% or less, still more preferably 5% or less, especially preferably 3% or less, from the viewpoint of reducing the amount of the abrasive remaining on the polished substrate. In order to adjust the percentage at 40 nm counted from a smaller particle size side on a number base in a cumulative particle size distribution to 25% or less, for instance, the content of the abrasive having a particle size of 40 nm or less may be made low. As a method for lowering the content of the abrasive of which particle size is 40 nm or less, a colloidal silica having a low content of particles having a small particle size can be prepared by controlling the addition rate of an active sol during the synthesis of colloidal silica in which silica sol is allowed to grow as a core. In addition, there would be no problem to classify a colloidal silica having a low content of particles having a small particle size with, for instance, a centrifuge or the like.

On the other hand, the particle size at 50% counted from a smaller size side on a number base in a cumulative particle size distribution (hereinafter also referred to as D50) is from 50 to 600 nm, preferably from 50 to 200 nm, more preferably from 50 to 150 nm, from the viewpoints of accomplishing economic polishing rate, and accomplishing excellent surface quality having excellent surface smoothness without surface defects.

In addition, it is preferable that the ratio of the particle size at 90% counted from a smaller size side on a number base in a cumulative particle size distribution (hereinafter also referred to as D90) to D50 [D90/D50] is from 1.3 to 3.0, more preferably from 1.3 to 2.0, from the viewpoints of accomplishing a high polishing rate, and accomplishing excellent surface quality having excellent surface smoothness without surface defects.

In addition, the particle size of the abrasive in Embodiments 1 and 2 above can be determined by the following method using a scanning electron microscope (hereinafter simply referred to as SEM). Specifically, a polishing composition comprising the abrasive is diluted with ethanol so that the abrasive concentration is 0.5% by weight. The diluted suspension is evenly applied to a sample plate for SEM heated to about 50° C. Thereafter, excess suspension is wiped off by a filter paper, and the coat is evenly air-dried so that the suspension is not aggregated.

Pt-Pd is deposited on the air-dried abrasive. Using an electric field effect scanning electron microscope (FE-SEM: Model S-4000) manufactured by Hitachi LTD., of which magnification is adjusted to 3000 to 100000 times so that about 500 abrasive particles can be observed within the scope, two pinpoints per one sample plate are observed and a microphotograph is taken thereat. Each microphotograph taken (0.1 m×0.13 m (4 inches×5 inches)) is enlarged to an A4 size (210 mm×297 mm) by a copy machine or the like, and the particle sizes of all the photographed abrasive particles are determined by calipers or the like and the data are summed up. The procedures are repeated for several runs, so that the number of abrasive particles to be determined is 2000 or more. It is more preferable that the number of determination points by SEM is increased, from the viewpoint of obtaining an accurate particle size distribution. The particle size distribution on a number base in the present invention can be obtained by summing up data for the determined particle sizes and adding its frequency (%) from a smaller particle size, with defining a particle size at 10% cumulative frequency as D10, a particle size at 50% cumulative frequency as D50, and a particle size at 90% cumulative frequency as D90. The particle size distribution as referred to herein is obtained as the particle size distribution of the primary particles, with proviso that when secondary particles in which primary particles of aluminum oxide, cerium oxide, fumed silica or the like are fused to each other are present, the particle size distribution can be obtained on the basis of the particle size of the secondary particle size thereof.

In addition, the method for adjusting the particle size distribution of the abrasive is not particularly limited. In the case where the abrasive is colloidal silica, the adjustment for the particle size distribution can be accomplished by, for instance, a method comprising adding a new particle acting as a core in the growth process of the particle during the preparation stage, to give a final product allowed to have a particle size distribution; a method of mixing two or more types of abrasives of which particle size distributions are different from each other; and the like.

As the abrasive used in the polishing composition of the present invention as represented by Embodiments 1 and 2 described above, any abrasives generally employed for polishing can be used. The abrasive includes, for instance, metals; carbides of metals or metalloids, nitrides of metals or metalloids, oxides of metals or metalloids, borides of metals or metalloids; diamond, and the like. The metals or metalloids include those elements belonging to the Groups 2A, 2B, 3A, 3B, 4A, 4B, 5A, 6A, 7A or 8 of the Periodic Table (long period form). Concrete examples of the abrasive include aluminum oxide, silicon carbide, diamond, magnesium oxide, zinc oxide, titanium oxide, cerium oxide, zirconium oxide, colloidal silica, fumed silica, and the like. Among them, aluminum oxide, colloidal silica, fumed silica, cerium oxide, zirconium oxide, titanium oxide, and the like are suitable for polishing semiconductor wafers and semiconductor elements and substrates for precision parts such as substrates for magnetic recording media. As to the aluminum oxide, those have various crystal forms such as α and γ have been known, which can be appropriately selected and used depending upon the applications. Among them, the colloidal silica is especially preferable, from the viewpoints of being suitable for an application of finish-polishing of a magnetic disk substrate having high recording density memory and an application of polishing a semiconductor substrate, which require a higher level of smoothness of the polished substrate. These abrasives can be used alone or in admixture of two or more kinds.

The content of the abrasive is preferably 0.5% by weight or more, more preferably 1% by weight or more, still more preferably 3% by weight or more, especially preferably 5% by weight or more, of the polishing composition, from the viewpoint of increasing the polishing rate, and the content of the abrasive is preferably 50% by weight or less, more preferably 40% by weight or less, still more preferably 30% by weight or less, especially preferably 25% by weight or less, of the polishing composition, from the viewpoint of improving the surface quality and from the viewpoint of economic advantages. The content is preferably from 0.5 to 50% by weight, more preferably from 1 to 40% by weight, still more preferably from 3 to 30% by weight, especially preferably from 5 to 25% by weight.

Water in the polishing composition of the present invention is used as a medium. From the viewpoint of efficiently polishing the object to be polished, the water content is preferably from 50 to 99.5% by weight, more preferably from 60 to 99% by weight, still more preferably from 70 to 97% by weight, especially preferably from 75 to 95% by weight, of the polishing composition.

In addition, there can be added other component to the polishing composition of the present invention as occasion demands. The other component includes metal salts, ammonium salts or amine salts of a monomeric form of acid compounds, peroxides, thickeners, dispersing agents, anti-corrosive agents, basic substances, surfactants, and the like. Concrete examples of the metal salts, ammonium salts or amine salts of a monomeric form of acid compounds, and peroxides are those listed in Japanese Patent Laid-Open No. Sho 62-25187, page 2, upper right column, lines 3 to 11; Japanese Patent Laid-Open No. Sho 63-251163, page 2, lower left column, lines 6 to 13; Japanese Patent Laid-Open No. Hei 1-205973, page 3, upper left column, line 4 to upper right column, line 2; Japanese Patent Laid-Open No. Hei 3-115383, page 2, lower right column, line 16 to page 3, upper left column, line 11; and Japanese Patent Laid-Open No. Hei 4-275387, page 2, right column, line 27 to page 3, left column, line 12 and lines 17 to 23.

In addition, as the polishing accelerator, there can be formulated a chelating compound having a multidentate ligand capable of forming a complex by binding with a metal ion. Concrete examples of the chelating compound include those described in Japanese Patent Laid-Open No. Hei 4-363385, page 2, right column, lines 21 to 29. Among them, iron (III) salts are preferable, and iron ethylenediaminetetraacete, and iron diethylenetriaminepentaacetate are especially preferable.

These components may be used alone or used in admixture of two or more kinds. In addition, the content of these components is preferably from 0.05 to 20% by weight, more preferably from 0.05 to 10% by weight still more preferably from 0.05 to 5% by weight, of the polishing composition, from the viewpoint of increasing the polishing rate, from the viewpoint of exhibiting each function, and from the viewpoint of economic advantages.

The concentration of each component of the above-mentioned polishing composition may be any of the concentration during the preparation of the composition and the concentration upon use. In many cases, the composition is usually prepared as a concentrate, which is diluted upon use.

It is preferable that the pH of the polishing composition is properly. determined depending upon the kinds of the object to be polished and the required properties. For instance, the pH of the polishing composition is preferably from 2 to 12, from the viewpoints of cleanability of the substrate, corrosiveness of working machines and safety of the workers. In addition, in the case where the object to be polished is the substrate for precision parts mainly made of a metal such as an aluminum alloy substrate produced by Ni-P plating, the pH of the polishing composition is more preferably from 2 to 9, especially preferably from 3 to 8, from the viewpoints of increasing the polishing rate and improving the surface quality. Further, in a case where the object to be polished is used for polishing semiconductor wafers and semiconductor elements, especially polishing silicon substrate, poly-silicon film, $SiO_2$ film, and the like, the pH of the polishing composition is preferably from 7 to 12, more preferably from 8 to 12, especially preferably from 9 to 11, from the viewpoints of increasing the polishing rate and improving the surface quality. The pH can be adjusted by properly adding an inorganic acid such as nitric acid or sulfuric acid, an organic acid, or a basic substance such as an aqueous ammonia, sodium hydroxide or potassium hydroxide, in a desired amount.

The polishing process of a substrate to be polished of the present invention comprises polishing a substrate to be polished by using the polishing composition of the present invention, or preparing a polishing liquid by mixing each component so as to give the composition of the polishing composition of the present invention. Examples of the polishing process include, for instance, a polishing process comprising clamping a substrate with polishing disks to which a polishing cloth made of nonwoven organic polymer fabric, is pasted; feeding a polishing composition to a polishing surface; and moving the polishing disks or the substrate, with applying a given pressure or the like. In the polishing process of the present invention, by using the polishing composition of the present invention, there can be exhibited such effects that the polishing rate is increased, that the generation of surface defects such as scratches and pits is suppressed, and that the surface roughness (Ra) can be reduced, whereby a substrate for precision parts can be favorably produced.

In addition, the process for producing a substrate of the present invention comprises the step of polishing a substrate to be polished by applying the polishing composition of the present invention.

The material for the object to be polished as represented by a substrate to be polished includes, for instance, metals or metalloids such as silicon, aluminum, nickel, tungsten, copper, tantalum and titanium; alloys made of these metals as the main components; glassy substances such as glass, glassy carbon and amorphous carbons; ceramic materials such as alumina, silicon dioxide, silicon nitride, tantalum nitride and titanium nitride; resins such as polyimide resins; and the like. Among them, a substrate to be polished is more preferably made of an aluminum alloy plated with Ni-P; a glass substrate such as crystallized glass or reinforced glass, and the aluminum alloy substrate plated with Ni-P is especially preferable.

The shape for the object to be polished is not particularly limited. For instance, those having shapes containing planar portions such as disks, plates, slabs and prisms, or shapes containing curved portions such as lenses can be subjects for polishing with the polishing composition of the present invention. Among them, the disc-shaped objects to be polished are especially preferable in polishing.

The polishing composition of the present invention can be favorably used in polishing the substrate for precision parts. For instance, the polishing composition is suitable for polishing substrates for magnetic recording media for magnetic disks, optical disks, opto-magnetic disks, and the like; photomask substrates, optical lenses, optical mirrors, optical prisms and semiconductive substrates. The polishing of the semiconductive substrate comprises the steps of polishing a silicon wafer (bare wafer), forming separation membrane for an embedded element, flattening an interlayer insulating film, forming an embedded metal line, and forming an embedded capacitor, and the like. The polishing composition of the present invention is especially suitable for polishing a magnetic disk substrate. Further, the polishing composition is suitable for obtaining a magnetic disk substrate having a surface roughness (Ra) of 0.3 nm (3 Å) or less. In the present specification, the surface roughness (Ra) is determined as so-called average deviation, of all points from a plane fit to the test part surface. The average deviation, of all points from a plane fit to the test part surface obtained from a roughness curve having a wave length component of 80 μm or less is expressed as Ra. The Ra can be determined as follows:

[Average Deviation, of All Points from Plane Fit to Test Part Surface (Ra)]

Determined under the following conditions using Talystep manufactured by Rank Taylor-Hobson Limited.

| | |
|---|---|
| Size of Tip End of Profilometer: | 2.5 μm × 2.5 μm |
| By-pass Filter: | 80 μm |
| Measurement Length: | 0.64 mm |

The method for producing a substrate of the present invention includes the polishing process by applying the above-mentioned polishing composition. It is preferable that the polishing process of the present invention is carried out in a second step or a subsequent step among the plural polishing steps, and it is especially preferable that the polishing process of the present invention is carried out in the final polishing step. For instance, the aluminum alloy substrate which is Ni-P plated to have a surface roughness (Ra) of 0.5 nm to 1.5 mn (5 Å to 15 Å) obtained in a single-step or two-step polishing process is polished by the polishing step using the polishing composition of the present invention, whereby a magnetic disk substrate having a surface roughness (Ra) of 0.3 nm (3 Å) or less, preferably a magnetic disk substrate having a surface roughness (Ra) of 0.25 nm (2.5 Å) or less, can be produced.

Especially, the polishing composition of the present invention is suitably used for the second step in the two-step polishing process during the production of a magnetic disk substrate having a surface roughness (Ra) of 0.3 nm (3 Å) or less, preferably a magnetic disk substrate having a surface roughness (Ra) of 0.25 nm (2.5 Å) or less.

The substrate thus produced is excellent in the surface smoothness. As the surface smoothness, it is desired that the surface roughness (Ra) is 0.3 nm (3 Å) or less, preferably 0.25 nm (2.5 Å) or less. In addition, the substrate mentioned above substantially has no surface defects.

As described above, by using the polishing composition of the present invention, there can be efficiently produced a high-quality magnetic disk substrate having excellent surface property such as little surface defects such as scratches and pits and improved surface smoothness such as surface roughness (Ra), at the same time increasing the polishing rate.

The polishing composition of the present invention especially has an effect in the polishing process, and the polishing composition can be similarly applied to a process other than the polishing process, for instance, a lapping process, and the like.

EXAMPLES

Examples I1 to I-5, and Comparative Examples I-1 to I-5

Figure 2:
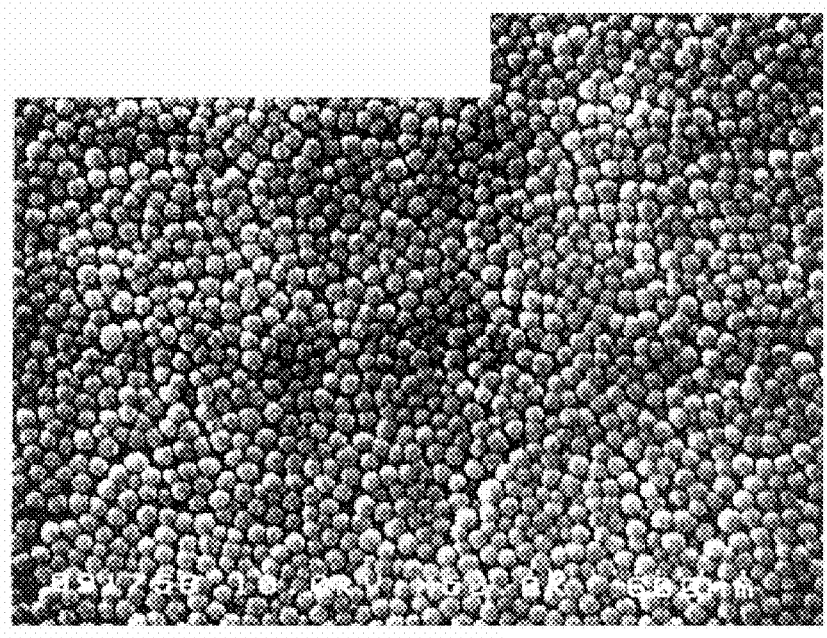
FIG. 2 is a photomicrograph of an FE-SEM image of an abrasive used in Comparative Example I-1.

As the abrasive, there were used colloidal silicas (Abrasives A to E shown in Tables 1 and 2) having the properties such that the cumulative particle sizes (D10, D50 and D90) as calculated in accordance with the method described in the section of DETAILED DESCRIPTION OF THE INVENTION (the particle size being determined by a caliper) using a scanning electron microscope (commercially available from HITACHI, LTD., model S-4000) are as shown in Table 1. A scanning electron photomicrograph (FE-SEM image, magnification: 50000) of the abrasive used in Example I-1 is shown in FIG. 1, and a scanning electron photomicrograph (FE-SEM image, magnification: 50000) of the abrasive used in Comparative Example I-1 is shown in FIG. 2.

TABLE 1

| | Abrasive A | Abrasive B | Abrasive C | Abrasive D | Abrasive E |
|---|---|---|---|---|---|
| D10 (nm) | 43 | 48 | 67 | 135 | 170 |
| D50 (nm) | 55 | 60 | 105 | 165 | 195 |
| D90 (nm) | 62 | 77 | 116 | 180 | 220 |

In order to obtain a polishing composition having a particle size distribution as define in the present invention, the abrasive was formulated in a proportion shown in Table 2 so that the abrasive concentration is 25% by weight, and thereto was further added 3% by weight of EDTA-Fe salt (commercially available from Chelest Corp. under the trade name of Chelest Fe) as a polishing accelerator, and balance ion-exchanged water, respectively, to prepare a polishing composition.

TABLE 2

| | Kinds of Abrasives (% by Weight) | | | | | Properties of Abrasives | | | | | | |
|---|---|---|---|---|---|---|---|---|---|---|---|---|
| Ex. No. | Abrasive A | Abrasive B | Abrasive C | Abrasive D | Abrasive E | D50S (nm) | D50L (nm) | D50L/ D50S | D10 (nm) | D50 (nm) | D90 (nm) | D90/ D50 |
| Ex. I-1 | 16.2 | | 6.3 | 2.5 | | 55 | 165 | 3.00 | 45 | 58 | 90 | 1.55 |
| Ex. I-2 | 15 | | 10 | | | 55 | 105 | 1.91 | 45 | 61 | 95 | 1.56 |

TABLE 2-continued

| Ex. No. | Kinds of Abrasives (% by Weight) | | | | | Properties of Abrasives | | | | | | |
|---|---|---|---|---|---|---|---|---|---|---|---|---|
| | Abrasive A | Abrasive B | Abrasive C | Abrasive D | Abrasive E | D50S (nm) | D50L (nm) | D50L/ D50S | D10 (nm) | D50 (nm) | D90 (nm) | D90/ D50 |
| Ex. I-3 | 7 | | 18 | | | 55 | 105 | 1.91 | 48 | 78 | 110 | 1.41 |
| Ex. I-4 | | | 12.5 | 12.5 | | 105 | 165 | 1.57 | 80 | 115 | 170 | 1.48 |
| Ex. I-5 | | | 10 | 10 | 5 | 105 | 195 | 1.86 | 78 | 125 | 180 | 1.44 |
| Comp. Ex. I-1 | 25 | | | | | | | | 43 | 55 | 62 | 1.13 |
| Comp. Ex. I-2 | | | 25 | | | | | | 67 | 105 | 116 | 1.10 |
| Comp. Ex. I-3 | | | | 25 | | | | | 135 | 165 | 180 | 1.09 |
| Comp. Ex. I-4 | 13 | | | | 12 | 55 | 195 | 3.55 | 50 | 65 | 210 | 3.23 |
| Comp. Ex. I-5 | 12.5 | 12.5 | | | | 55 | 60 | 1.09 | 45 | 57 | 67 | 1.18 |

Each of the resulting polishing compositions was evaluated for its polishing properties by using an Ni-P plated, aluminum alloy substrate having a surface roughness Ra of 1.5 nm (15 Å), a thickness of 0.8 mm, and a diameter of 95 mm as a substrate to be polished. The polishing conditions and the evaluation methods are as follows.

Set Conditions for Double-Sided Processing Machine
  Processing machine: double-sided processing machine, Model 9B, manufactured by SPEEDFAM CO., LTD.
  Polishing pad: "POLYTEX DG-H" (manufactured by Rodel Nitta K.K.).
  Disc rotational speed: 50 r/min
  Feeding flow rate for a slurry: 20 mL/min
  Polishing time period: 4 minutes
  Polishing load: 7.8 kPa
  Number of substrates introduced: 10

[Polishing Rate]

The polishing rate was determined from a weight change of each aluminum alloy substrate before and after polishing, and a relative value (relative polishing rate) was calculated based on the polishing rate of the polishing composition in Comparative Example I-2 which was polished with a colloidal silica having an average particle size (D50) of 105 nm as a standard. The results are shown together in. Table 3.

[Determination of Surface Roughness]

The average deviation, of all points from plane fit to test part surface (Ra) was determined under the following conditions by using Talystep commercially available from Rank Taylor-Hobson Limited. The results are shown in Table 3
  Size of tip end of profilometer: 2.5 μm×2.5 μm.
  By-pass filter: 80 μm
  Measurement length: 0.64 mm

[Determination of Scratches]

Each of the substrate surface was observed with an optical microscope (differential interference microscope) with a magnification of 200 times at 6 locations at 60-degree intervals. The depth of the scratches was determined by an atomic force microscope (AFM; commercially available from Digital Instruments, "Nanoscope III"). The results are shown in Table 3.

[Determination of Pits]

Each of the substrate surface was observed with an optical microscope (differential interference microscope) with a magnification of 200 times at 12 locations at 30-degree intervals. The number of pits per 12 scopes was counted. The results are shown in Table 3.

Evaluation Criteria

An average value for each item determined for each of the substrates polished by the polishing compositions shown in Table 3 was obtained, and evaluated in accordance with the following criteria:

| Surface Roughness (Ra) | ⊚: 0.2 nm (2Å) or less | ○: 0.3 nm (3Å) or less | x: exceeding 0.3 nm (3Å) |
|---|---|---|---|
| Scratches | | ○: 0.5 lines or less | x: exceeding 0.5 lines |
| Pits | | ○: 3/face or less | x: exceeding 3/face |

TABLE 3

| | Relative Polishing Rate | Surface Roughness Ra | Surface Defects | |
|---|---|---|---|---|
| | | | Scratches | Pits |
| Ex. I-1 | 1.7 | ⊚ | ⊚ | ○ |
| Ex. I-2 | 1.5 | ○ | ○ | ○ |
| Ex. I-3 | 1.6 | ○ | ○ | ○ |
| Ex. I-4 | 1.8 | ○ | ○ | ○ |
| Ex. I-5 | 1.6 | ○ | ○ | ○ |
| Comp. Ex. I-1 | 0.6 | ○ | ○ | ○ |
| Comp. Ex. I-2 | 1.0 | ○ | ○ | ○ |
| Comp. Ex. I-3 | 1.1 | x | x | ○ |
| Comp. Ex. I-4 | 1.2 | x | x | ○ |
| Comp. Ex. I-5 | 0.7 | ○ | ○ | ○ |

It is clear from the results shown in Table 3 that the polishing compositions obtained in Examples I-1 to 1-5 had increased polishing rates, so that the resulting polished objects had excellent surface smoothness and were free from surface defects such as scratches and pits, as compared to the polishing compositions obtained in Comparative Examples I-1 to I-5.

Examples II-1 to II-5 and Comparative Examples II-1 to II-2

Figure 3:
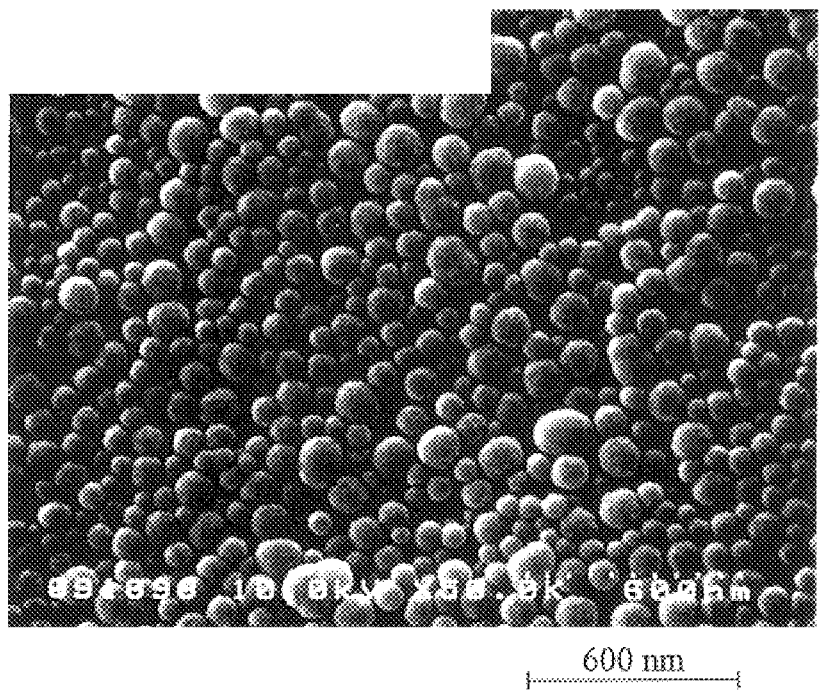
FIG. 3 is a photomicrograph of an FE-SEM image of an abrasive used in Example II-2.
Figure 4:
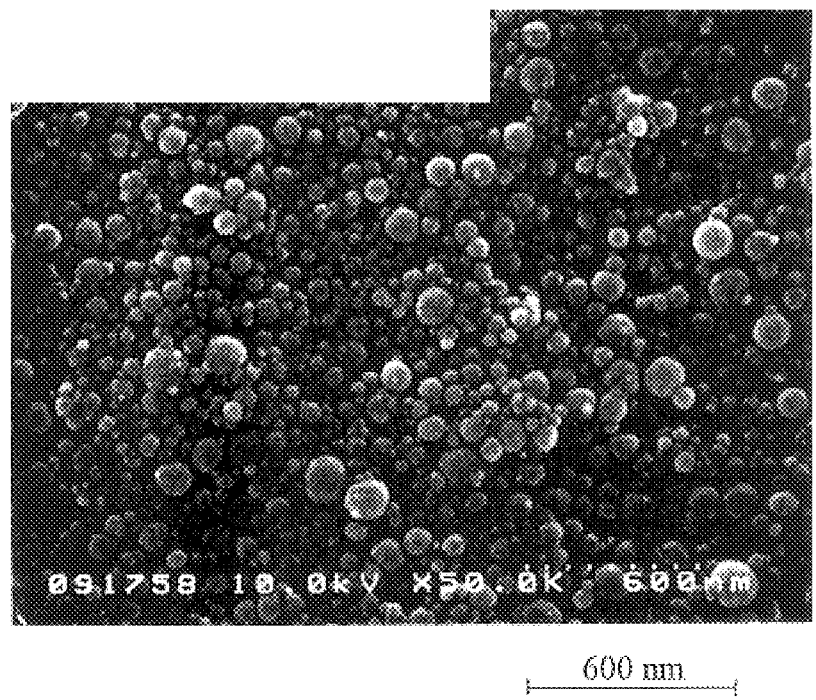
FIG. 4 is a photomicrograph of an FE-SEM image of an abrasive used in Comparative Example II-1.
Figure 5:
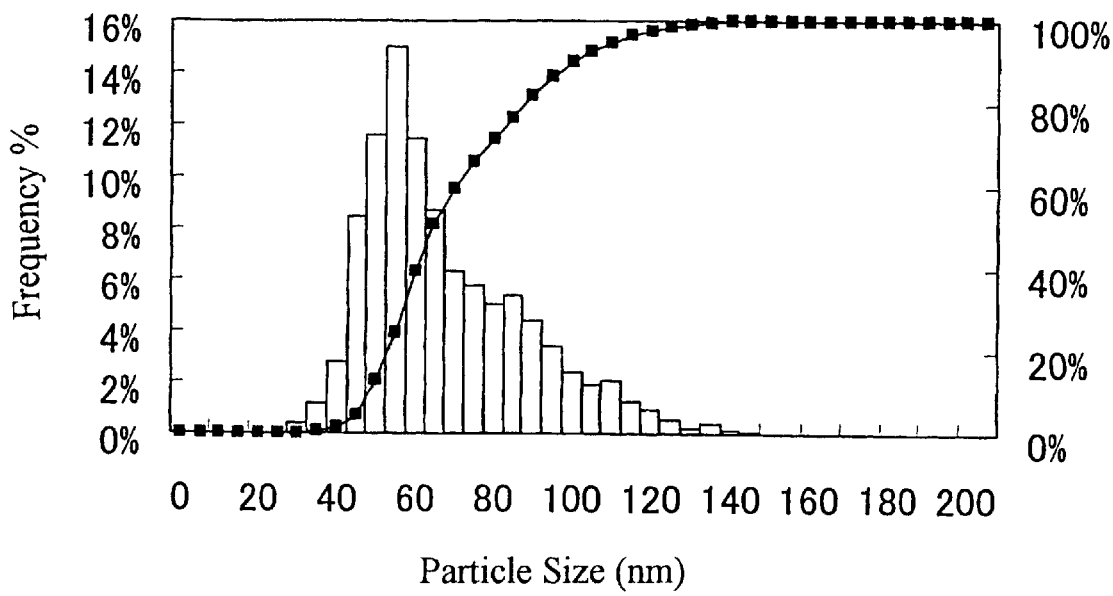
FIG. 5 is a graph showing a particle size distribution of an abrasive used in Example II-3.
Figure 6:
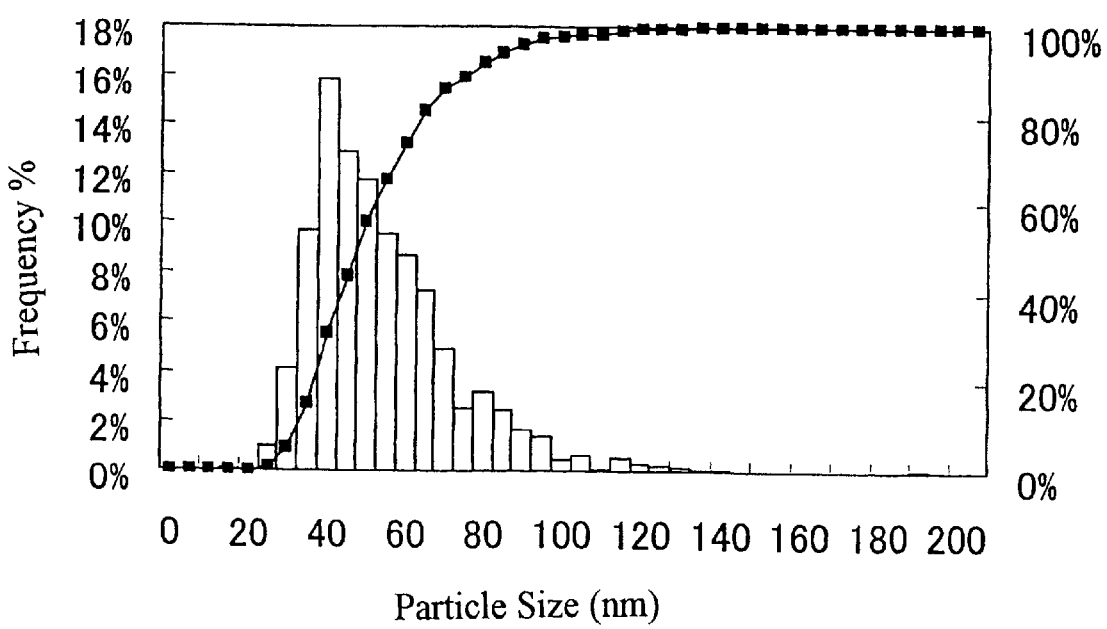
FIG. 6 is a graph showing a particle size distribution of an abrasive used in Comparative Example II-1.

As the abrasive, there were used colloidal silicas having the cumulative particle size D50 as calculated in accordance with the method described in the section of DETAILED DESCRIPTION OF THE INVENTION (the particle size being determined by a caliper) using a scanning electron microscope (commercially available from HITACHI, LTD., model S-4000) is respectively from 25 to 160 nm. The colloidal silicas were formulated in proper amounts to prepare an abrasive having a particle size distribution (cumulative particle size distribution at 40 nm, D50, D90 and D50/D90) as shown in Table 4. Twenty-five parts by weight of each of the resulting abrasive was added and mixed with 72 parts by weight of ion-exchanged water, and thereafter, 3 parts by weight of EDTA-Fe salt (commercially available from Chelest Corp. under the trade name of Chelest Fe) was further added thereto as a polishing accelerator, to prepare a polishing composition. In addition, in Example II-2, an abrasive was prepared by classifying and removing that having a small particle size from the abrasive of Comparative Example II-2 by using a centrifuge to be used for polishing. A scanning electron photomicrograph (FE-SEM image, magnification: 50000) of the abrasive used in Example II-2 is shown in FIG. 3, and a scanning electron photomicrograph (FE-SEM image, magnification: 50000) of the abrasive used in Comparative Example II-1 is shown in FIG. 4. Also, the particle size distribution of the abrasive used in Example II-3 is shown in FIG. 5, and the particle size distribution of the abrasive used in Comparative Example II-1 is shown in FIG. 6.

The evaluation for polishing was made by using an Ni-P plated, aluminum alloy substrate having a surface roughness Ra of 1.5 nm (15 Å), a thickness of 0.8 mm, and a diameter of 95 mm as a substrate to be polished. The polishing conditions are the same as those described above.

The polishing rate was determined from a weight change of each aluminum alloy substrate before and after polishing, and a relative value (relative polishing rate) was calculated based on the polishing rate in Comparative Example II-2 which was polished with a colloidal silica having an average particle size (D50) of 100 nm as a standard. The results are shown together in Table 4.

Evaluation on Abrasive Remaining on the Polished Substrate

Figure 7:
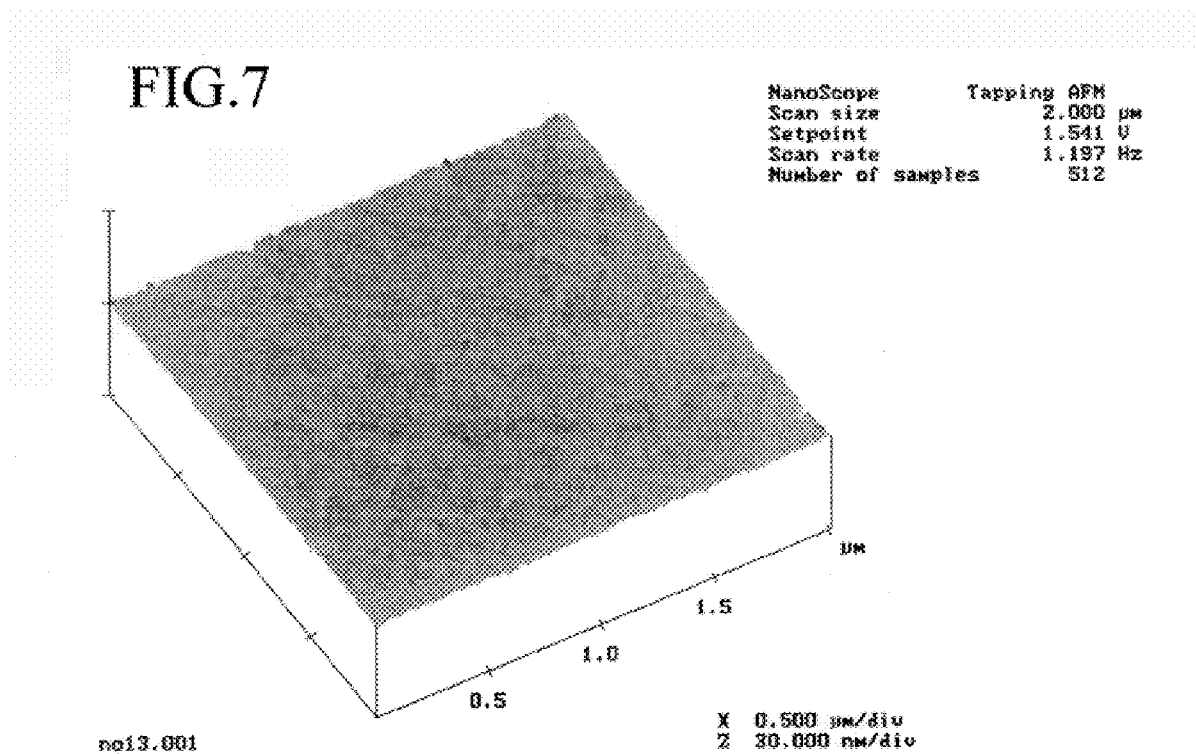
FIG. 7 is an AFM image after washing the polished substrate polished by using the polishing composition of Example II-3.
Figure 8:
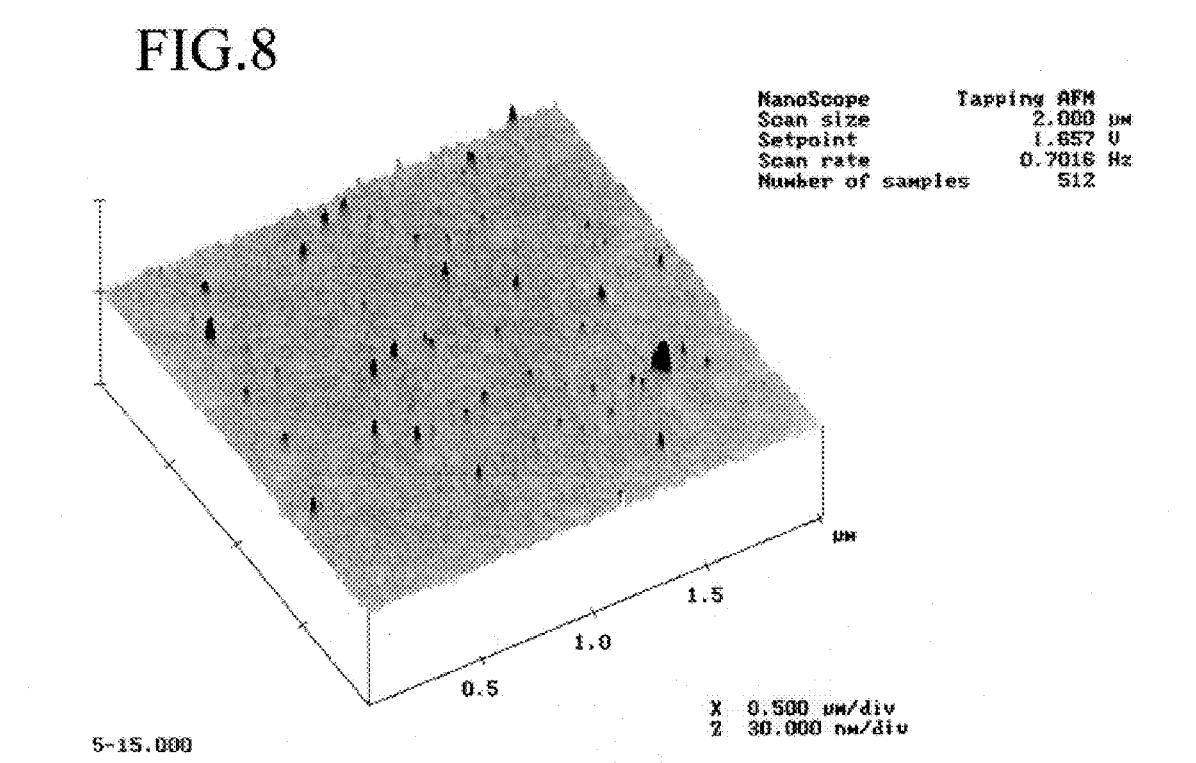
FIG. 8 is an AFM image after washing the polished substrate polished by using the polishing composition of Comparative Example II-1.

The abrasive remaining on the polished substrate was detected at 3 locations each on front and back sides of the polished substrate, each within a scope of 10 μm×10 μm, by using an atomic force microscope (AFM; commercially available from Digital Instruments, "Nanoscope III") at a scan rate of 1 Hz, to confirm the presence or absence of the remaining abrasive (residual abrasive grains). The results are shown in Table 4. An AFM image of a cleaned polished substrate which was polished by using the polishing composition of Example II-3 is shown in FIG. 7, and an AFM image of a cleaned polished substrate which was polished by using the polishing composition of Comparative Example II-1 is shown in FIG. 8.

In addition, the determinations of the surface roughness, the scratches and the pits were each made in accordance with the same methods as described above.

With respect to the substrates polished by the polishing compositions described in Table 4, the average value of each item was determined and evaluated.

| | | |
|---|---|---|
| Residual Abrasive | ○: 5 or less/ 10 μm × 10 μm | x: exceeding 5/ 10 μm × 10 μm |
| Surface Roughness (Ra) | ○: 0.3 nm (3Å) or less | x: exceeding 0.3 nm (3Å) |
| Scratches | ○: 0.5 lines or less | x: exceeding 0.5 lines |
| Pits | ○: 3/face or less | x: exceeding 3/face |

TABLE 4

| | Particle Size Distribution of Abrasive | | | | Evaluation of Properties of Polishing Composition | | | | |
|---|---|---|---|---|---|---|---|---|---|
| Ex. No. | Cumulative Particle Size Distribution at 40 nm (%) | D50 (nm) | D90 (nm) | D90/ D50 | Relative Polishing Rate | Residual Abrasive Grain | Surface Roughness (Ra) | Scratches | Pits |
| Ex. II-1 | 0.0 | 137 | 196 | 1.43 | 1.5 | ○ | ○ | ○ | ○ |
| Ex. II-2 | 0.5 | 85 | 120 | 1.41 | 1.8 | ○ | ○ | ○ | ○ |
| Ex. II-3 | 2.9 | 67 | 104 | 1.55 | 1.8 | ○ | ○ | ○ | ○ |
| Ex. II-4 | 18.4 | 62 | 86 | 1.39 | 1.6 | ○ | ○ | ○ | ○ |
| Ex. II-5 | 13.6 | 58 | 77 | 1.33 | 1.3 | ○ | ○ | ○ | ○ |
| Comp. Ex. II-1 | 30.8 | 50 | 81 | 1.62 | 1.3 | x | ○ | ○ | ○ |
| Comp. Ex. II-1 | 34.6 | 43 | 51 | 1.19 | 1.0 | x | ○ | ○ | ○ |

It is clear from the results shown in Table 4 that the polishing compositions obtained in Examples II-1 to II-5 had increased polishing rates, so that the resulting polished substrates had no residues of the abrasive and excellent surface smoothness and were free from surface defects such as scratches and pits, as compared to the polishing compositions obtained in Comparative Examples II-1 and II-2.

According to the present invention, there is exhibited such an effect that there can be efficiently produced a substrate for precision parts for memory hard disks, semiconductor elements and the like having little surface defects such as projections and polishing damages, and improved surface smoothness as represented by the surface roughness.

In addition, according to the present invention, there are exhibited such effects that there can be efficiently produced a polished substrate for memory hard disks and the like having no residual abrasive on the polished substrate after polishing and cleaning, little surface defects such as scratches and pits, and improved surface smoothness such as the surface roughness (Ra).

What is claimed is:

1. A polishing composition comprising an abrasive and water, wherein the abrasive is a colloidal silica and has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution.

2. The polishing composition according to claim 1, wherein the abrasive has a particle size distribution such that D10 is from 5 to 100 nm, wherein D10 is defined as a particle size at 10% counted from a smaller size side on a number base in a cumulative particle size distribution.

3. A polishing composition comprising two or more types of abrasives of which D50s are different from each other and water, wherein a ratio of D50L to D50S (D50L/D50S) is from 1.1 to 3.0, and a weight ratio of an abrasive (A) to an abrasive (B) [A/B] is from 90/10 to 10/90, wherein D50 is defined as a particle size at 50% counted from a smaller size side on a number base in a cumulative particle size distribution, wherein the abrasive (A) is defined as an abrasive having the smallest D50 and the abrasive (B) is defined as an abrasive having the largest D50, and wherein D50L is defined as a D50 owned by the abrasive (B) and D50S is defined as a D50 owned by the abrasive (A), wherein the abrasive (A) or (B) is a colloidal silica.

4. A process for polishing a substrate, comprising polishing the substrate with a polishing composition, said polishing composition comprising an abrasive and water, wherein said abrasive is a colloidal silica and has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution.

5. A process for polishing a substrate, comprising polishing the substrate with a polishing composition, said polishing composition comprising two or more types of abrasives of which D50s are different from each other and water, wherein a ratio of D50L to D50S (D50L/D50S) is from 1.1 to 3.0, and a weight ratio of an abrasive (A) to an abrasive (B) [A/B] is from 90/10 to 10/90, wherein D50 is defined as a particle size at 50% counted from a smaller size side on a number base in a cumulative particle size distribution, wherein the abrasive (A) is defined as an abrasive having the smallest D50 and the abrasive (B) is defined as an abrasive having the largest D50, and wherein D50L is defined as a D50 owned by the abrasive (B) and D50S is. defined as a D50 owned by the abrasive (A), wherein the abrasive (A) or (B) is a colloidal silica.

6. A process for polishing a substrate, comprising polishing the substrate with a polishing composition, said polishing composition comprising an abrasive and water, wherein the abrasive is a colloidal silica and has a particle size distribution such that a percentage at a particle size of 40 nm counted from a smaller size side on a number base in a cumulative particle size distribution is 25% or less, and wherein D50 is from 50 to 600 nm, wherein D50 is defined as a particle size at 50% counted from a smaller size side on a number base in a cumulative particle size distribution.

7. A process for producing a substrate, comprising the step of
polishing the substrate with a polishing composition, said polishing composition comprising an abrasive and water, wherein said abrasive is a colloidal silica and has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution.

8. A process for producing a substrate, comprising the step of polishing the substrate with a polishing composition, said polishing composition comprising two or more types of abrasives of which D50s are different from each other and water, wherein a ratio of D50L to D50S (DS0L/D50S) is from 1.1 to 3.0, and a weight ratio of an abrasive (A) to an abrasive (B) [A/B] is from 90/10 to 10/90, wherein D50 is defined as a particle size at 50% counted from a smaller size side on a number base in a cumulative particle size distribution, wherein the abrasive (A) is defined. as an abrasive having the smallest D50 and the abrasive (B) is defined as an abrasive having the largest D50, and wherein D50L is defined as an D50 owned by the abrasive (B) and D50S is defined as a D50 owned by the abrasive (A), wherein the abrasive (A) or (B) is a colloidal silica.

9. A process for producing a substrate, comprising the step of polishing the substrate with a polishing composition, said polishing composition comprising an abrasive and water, wherein the abrasive is a colloidal silica and has a particle size distribution such that a percentage at a particle size of 40 nm counted from a smaller size side on a number base in a cumulative particle size distribution is 25% or less, and wherein D50 is from 50 to 600 nm, wherein D50 is defined as a particle size at 50% counted from a smaller size side on. a number base in a cumulative particle size distribution.

10. The polishing composition according to claim 1, wherein said D50 is from 40 to 100 nm.

11. The polishing composition according to claim 2, wherein said D10 is from 35 to 70 nm.

12. The polishing composition according to claim 3, wherein the abrasive obtained by mixing said two or more types of abrasives has a particle size distribution such that (1) a ratio of D90 to D50 (D90/D50) is from 1.3 to 3.0, and (2) D50 is from 10 to 600 nm, wherein D90 is defined as a particle size at 90% counted from a smaller size side on a number base in a cumulative particle size distribution, and wherein D50 is defined as a particle size at 50% counted from a smaller size side on a number base in a cumulative particle size distribution.

13. The polishing composition according to claim 12, wherein said $D_{50}$ is from 40 to 100 nm.

14. The polishing composition according to claim 3, wherein the abrasive obtained by mixing said two or more types of abrasives has a particle size distribution such that D10 is from 5 to 100 nm, wherein D10 is defined as a particle size at 10% counted from a smaller size side on a number base in a cumulative particle size distribution.

15. The polishing composition according to claim 14, wherein said D10 is from 35 to 70 nm.

16. The process according to claim 4, wherein a substrate having a surface roughness of 3 Å or less is obtained.

17. The process according to claim 5, wherein a substrate having a surface roughness of 3 Å or less is obtained.

18. The process according to claim 6, wherein a substrate having a surface roughness of 3 Å or less is obtained.

19. The process according to claim 7, wherein a substrate having a surface roughness of 3 Å or less is obtained.

20. The process according to claim 8, wherein a substrate having a surface roughness of 3 Å or less is obtained.

21. The process according to claim 9, wherein a substrate having a surface roughness of 3 Å or less is obtained.

22. A polishing composition comprising an abrasive and water, wherein the abrasive has a particle size distribution such that a percentage at a particle size of 40 nm counted from a smaller size side on a number base in a cumulative particle size distribution is 25% or less, and wherein D50 is from 50 to 600 nm, wherein D50 is defined as a particle size at 50% counted from a smaller size side on a number base in a cumulative particle size distribution, wherein the abrasive is a colloidal silica.

23. The polishing composition according to claim 22, wherein a percentage at a particle size of 40 nm counted from smaller size side on a number base in a cumulative particle size distribution is 10% or less.

24. The process according to claim 4, wherein the substrate is a substrate for magnetic recording media.

25. The process according to claim 5, wherein the substrate is a substrate for magnetic recording media.

26. The process according to claim 6, wherein the substrate is a substrate for magnetic recording media.

27. The process according to claim 7, wherein the substrate is a substrate for magnetic recording media.

28. The process according to claim 8, wherein the substrate is a substrate for magnetic recording media.

29. The process according to claim 9, wherein the substrate is a substrate for magnetic recording media.

* * * * *